United States Patent [15] 3,648,188

Ratcliff [45] Mar. 7, 1972

[54] TRANSISTOR POWER AMPLIFIER

[72] Inventor: Henry K. Ratcliff, Davenport, Iowa

[73] Assignee: The Bendix Corporation

[22] Filed: June 10, 1970

[21] Appl. No.: 45,163

[52] U.S. Cl. ....................330/26, 307/261, 330/31, 330/196

[51] Int. Cl. ....................H03f 1/38

[58] Field of Search ....................330/21, 26, 28, 31, 196; 307/261; 328/22, 223; 331/165, 166

[56] References Cited

UNITED STATES PATENTS

| | | | |
|---|---|---|---|
| 3,415,949 | 12/1968 | Williams | 331/166 X |
| 3,471,796 | 10/1969 | Wright | 330/31 X |
| 3,206,694 | 9/1965 | Bates | 331/165 X |
| 2,954,527 | 9/1960 | Bradmiller | 328/223 X |
| 3,026,486 | 3/1962 | Pintell | 331/113 |
| 3,239,772 | 3/1966 | Dennis | 330/31 X |

*Primary Examiner*—Roy Lake
*Assistant Examiner*—James B. Mullins
*Attorney*—William N. Antonis and Plante, Hartz, Smith & Thompson

[57] ABSTRACT

An AC amplifier which has a theoretical efficiency of 100 percent and which is particularly suitable for amplification or generation of AC power at radiofrequencies. The amplifier operates in a switching mode with a transformer being used to couple the switched DC supply through a series tuned circuit to a load connected to the secondary of the transformer. A means is also provided to insure the energy in the magnetic field of the primary is transferred without loss to the secondary circuit during pulsation of the DC supply.

10 Claims, 6 Drawing Figures

Patented March 7, 1972 3,648,188

2 Sheets-Sheet 1

INVENTOR.
HENRY K. RATCLIFF
BY
Plante, Hartz, Smith & Thompson
ATTORNEYS

INVENTOR.
HENRY K. RATCLIFF
BY
Plante, Hartz, Smith & Thompson
ATTORNEYS

TRANSISTOR POWER AMPLIFIER

BACKGROUND OF THE INVENTION

There has long existed a need for an RF amplifier having a high efficiency, particularly at power levels needed in radiofrequency power amplifiers. It is well known to those skilled in the art that radiofrequency amplifiers that fall within the power classification normally use tank circuit which smooths out irregularities in the current waveform to give a comparatively pure sine wave input. In addition, more efficient conditions of operation are employed than for conventional audio amplifier operation. Class B and C amplifiers fall into this grouping. However, they utilize parallel tank circuits to obtain the high input impedance necessary for proper operation.

A Class B radiofrequency (RF) amplifier is used when the power level of the signal is to be increased, but with a linear relationship between the input and output voltages. A Class C RF amplifier is more efficient than a Class B amplifier, but a linear relationship between the input and output voltage does not exist. The maximum theoretical efficiency for the linear, or Class B RF amplifier, is the same as for the Class B audio amplifier, that is, 78.5 percent. Usual peak operating efficiencies are between 60 and 70 percent. Although theoretical efficiency of the Class C amplifier is as high as 90 percent, most class C amplifiers are designated to operate at efficiencies of the order of 75 percent.

It is well known to those skilled in the art that transistors which operate in a switching mode are normally driven into saturation for more efficient operation. Saturation may be defined as that point where a further increase in input signal does not substantially provide any increase in the output signal. For a common emitter configuration, saturation occurs when an increase in base current does not cause an appreciable increase in collector current. In normal switching modes of operation, a collector current follows the base current input and the transistors are generally driven by means of a square wave input or a trigger to cause saturation as quickly as possible. Therefore, a maximum collector current is obtained with the lowest possible value of saturation resistance. It has previously been found that the efficiency of an amplifying transistor can be increased by providing, in the output circuit, harmonics of the fundamental frequency to be amplified. This causes the harmonics of the voltage waveform to be different from those in the current waveform.

It is an object of this invention to provide a power amplifier circuit which permits the more efficient use of power transistors.

It is a further object of this invention to show a circuit with the ability to efficiently amplify or generate RF power from a low or medium frequency transistor.

It is a still further object of the invention to use a transformer to isolate the series circuit from the switched DC supply with switching to the DC supply being accomplished with a single transistor. The isolation of the series circuit from the DC supply avoids the expense of discharge power transistors and losses that occur in their collector and base circuits.

It is an even further object of this invention to provide a recovery circuit that tunes out unwanted reactances in the collector of the transistor, thus permitting operation at radiofrequency. All these objects are made available simultaneously with high output power at a level usually associated only with transmitting tubes. A nebulizer or atomizer is a typical device that could utilize a circuit meeting the above objects.

DESCRIPTION OF THE PREFERRED EMBODIMENT

Figures 1, 2, 3:
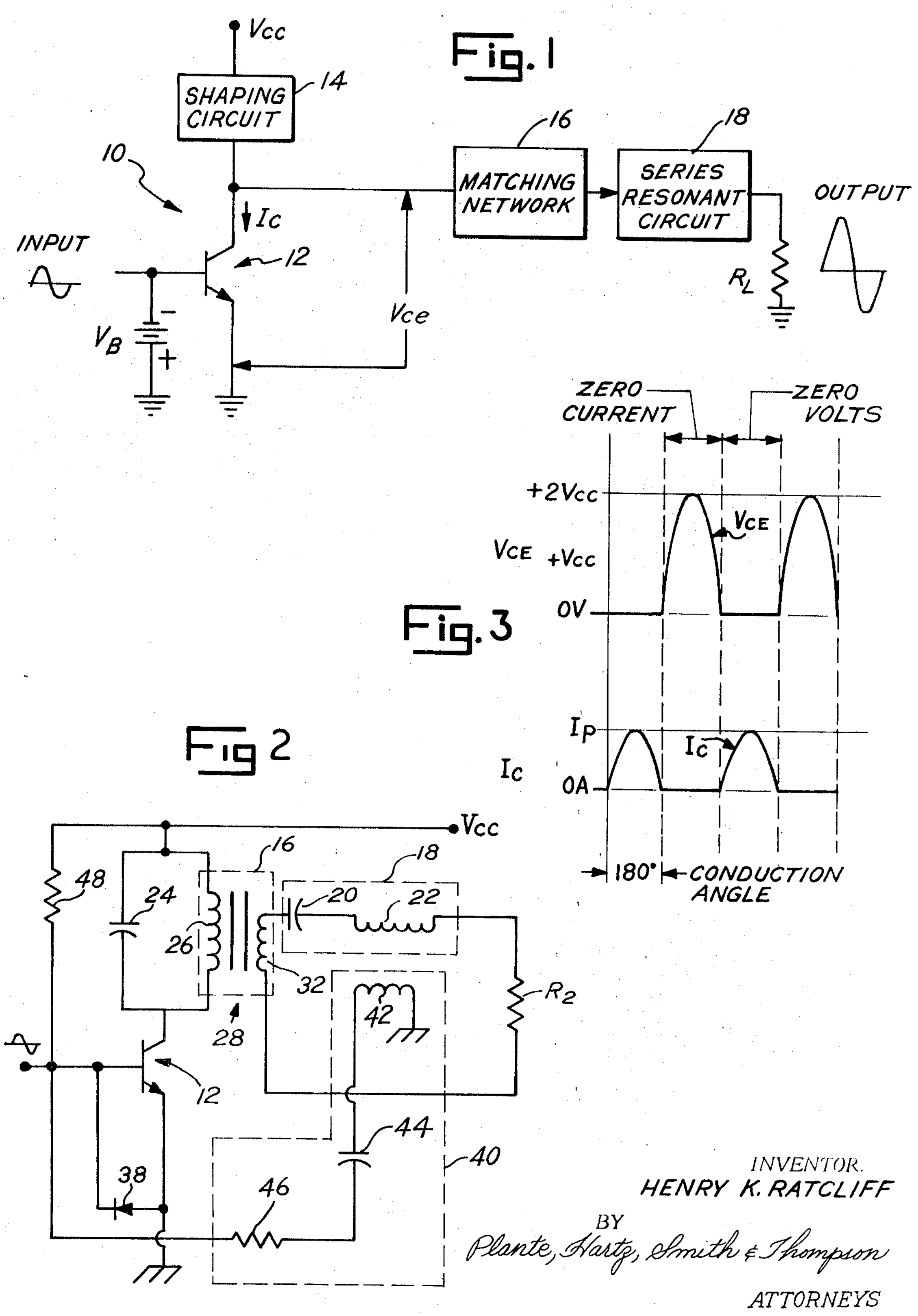
FIG. 1 is a pictorial block diagram of the transistor power amplifier.
FIG. 2 is a detail schematic of the representative block diagram shown in FIG. 1.
FIG. 3 is a graphic illustration of the collector current and collector-emitter voltage of the transistor shown in FIG. 1.

The pictorial block diagram shown in FIG. 1, and represented generally by the reference numeral 10, shows the basic principal of the new approach to radiofrequency amplification with very little or no loss. The high efficiency obtained by the new approach is because the collector voltage $V_{ce}$ appearing across the transistor 12 and the collector current $I_c$ are made to occur in the form of alternate half-cycles or pulses as shown in FIG. 3. Thus, since $V_{ce}$ and $I_c$ are not present at the same time, the power loss in the device is zero. Part of the energy contained in the current pulse $I_c$ is stored in a shaping circuit 14 with the rest being transmitted directly to the load $R_L$ during the conduction phase of the transistor. During the collector voltage $V_{ce}$ part of the cycle, the energy stored in the shaping circuit is applied through a matching network 16 to a series resonant circuit 18 which in turn develops a sinusoidal voltage across the load resistor $R_L$. This circuit configuration is capable of developing sinusoidal power with an efficiency approaching 100 percent. The magnitude of the power is limited only by the absolute maximum voltage and current rating of the transistor 12.

It should be noted that maximum power output is obtained in Class B configuration and highest efficiency in Class C. In practice, however, a Class C amplifier will yield the greater power output. This is because the limitations imposed by the transistor dissipation parameter $P_d$ restricts Class C output to about 40 percent of the theoretical maximum. Table I which follows enables a direct comparison between Class B, Class C and the present circuit configuration which we shall call Class $B_x$. It should be noted that Class $B_x$ not only combines the advantages of Class B (high output) and Class C (high efficiency), but does so in a very efficient manner.

TABLE I

Class $B_x$ operation compared with conventional modes B and C

| Mode of operation | Conduction angle, degrees | Maximum power output (Watts) | | Theoretical efficiency, percent |
|---|---|---|---|---|
| | | Theoretical | Practical case | |
| Class B | 180 | High—0.25 $V_{cc}I_p$ (See Note 2). | Output limited by transistor dissipation to 0.10 $V_{cc}I_p$. | 78 |
| Class C | [1] 120 | Moderate—54% that of Class B. 0.135 $V_{cc}I_p$. | Output fully useable and not limited by transistor dissipation 0.135 $V_{cc}I_p$. | 90 |
| Class $B_x$ | 180 | Very high—greater than Class B, 0.317 $V_{cc}I_p$. | Output fully useable and not limited by transistor dissipation. 0.317 $V_{cc}I_p$ (See Note 3) | 100 |

[1] Typically.

Note 1. An ideal transistor has been assumed for the table—in practice, many of the latest power transistors when operating at low or medium frequencies very closely approach this ideal.

Note 2. $V_{cc}$ = DC supply volts (limited by maximum voltage rating of transistor).

$I_p$ = Peak current flowing in transistor (limited by current rating of device).

The expressions in this table give power output in watts.

Note 3. In practice, collector current pulses tend to be wider than the half sinusoids on which above figures were calculated; hence, power output would tend to exceed theoretical maximum of Class $B_x$.

The Class $B_x$ approach should also be compared with the switching and inverter mode of operation—an inverter being defined as a power conversion device used to transform DC power to AC power. A wide variety of inverter circuits have been developed for a low frequency power conversion, and they have also found application in sonics. Some of the main characteristics of the switching inverter are:

A. Square wave output voltage similar to the multivibrator.

B. Fundamental frequency determined by feedback network.

C. Circuit efficiency high (typically 85 percent) but decreases in direct proportion to the operating frequencies.

One of the major disadvantages of the inverter circuit is that there will be a collector voltage $V_{ce}$ and a collector current $I_c$ present simultaneously during the transient stage of the switching operation. When both $V_{ce}$ and $I_c$ are present, a loss of power will result through the conversion of electrical energy to thermal energy.

Another disadvantage of the switching inverter is that unlike Class B, C and $B_x$ oscillators, it is unable to automatically compensate for changes in the resonant frequency of a transducer load. If such changes occur, the power delivered to the load will fall and power losses in the transistor will rise.

Figures 4, 5, 6:
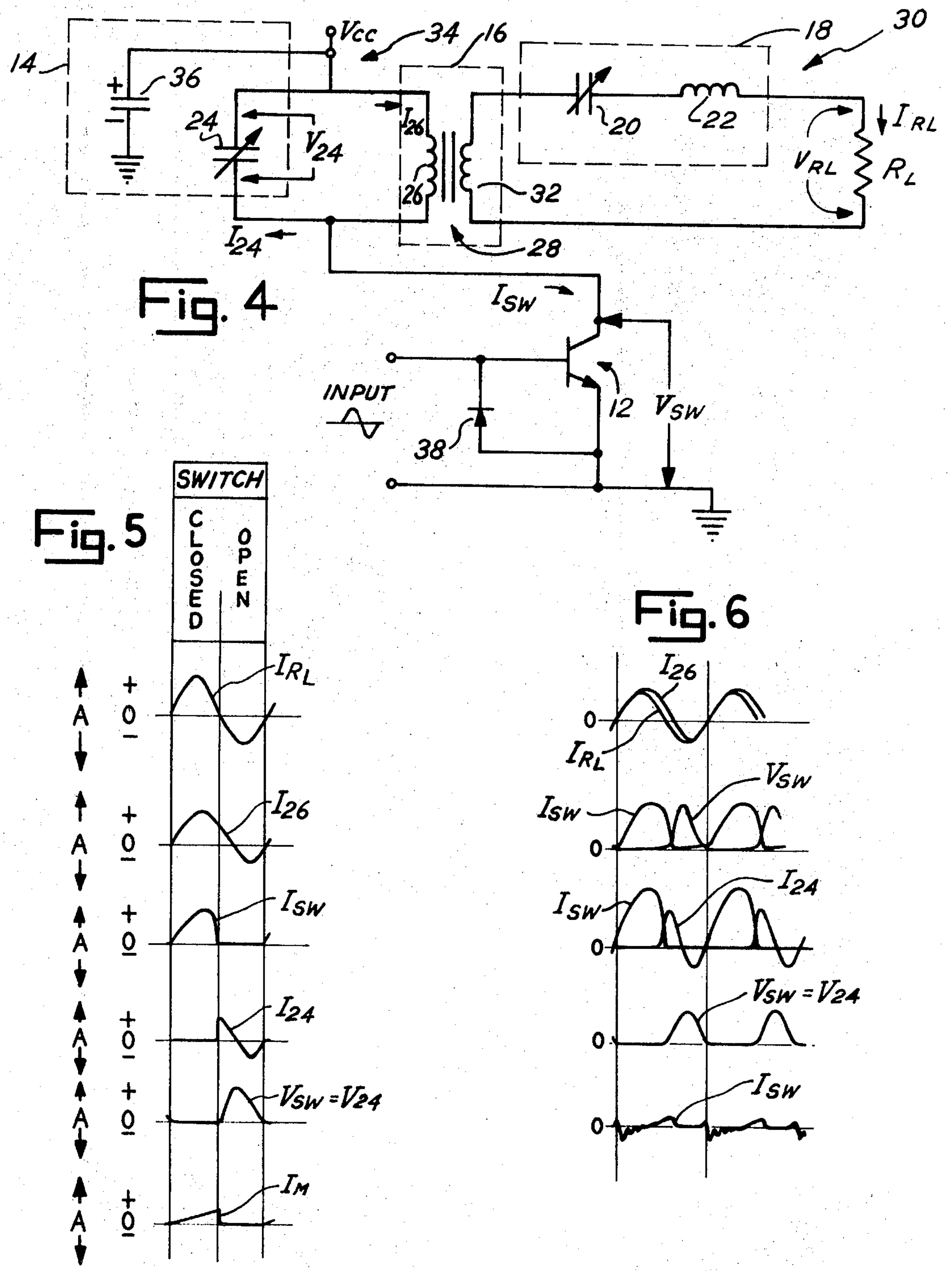
FIG. 4 is a detailed schematic of another embodiment of the representative block diagram shown in FIG. 1.
FIG. 5 is a graphic illustration of the theoretical voltage and current waveforms found in FIG. 4.
FIG. 6 is the laboratory measured voltage and current waveforms found in FIG. 4.

Referring now to FIG. 4, one will find a detailed schematic of one possible embodiment of the blocked diagram 10. For the purpose of this description, the transistor 12 will be represented by a simple switch SW. This switch SW is closed to charge the series resonant circuit 18 which consists of adjustable capacitor 20 and inductor 22. A variable capacitor 24 is provided to bring the recovery of primary winding 26 of transformer 28, a process in which the series circuit 18 also plays a part. The recovery of the primary winding 26 takes place in the second half of a cycle when switch SW is open and results in the energy stored in the magnetic field of the primary winding 26 being transferred to the load $R_L$. This operation will be described in greater detail in a subsequent paragraph.

The secondary circuit, represented generally by reference numeral 30, comprises a secondary winding 32 in series with resonant circuit 18 containing variable capacitor 20 and inductor 22, and load $R_L$. The series resonant circuit 18 is charged by the action of the transformer 28. Each time the switch SW closes, transformer 28 couples energy into the secondary circuit 30 thus causing a positive half sinusoid of current to flow through load resistor $R_L$.

The primary circuit, represented generally by reference numeral 34, comprises the primary winding 26 of transformer 28, recovery capacitor 24, switch SW, a DC supply represented by voltage $V_{cc}$, and supply capacitor 36. With the switch SW closed, no change occurs in the voltage of the variable capacitor 24. This is because the upper plate of the variable capacitor 24 is directly connected to the positive terminal of the supply voltage $V_{cc}$, while the lower plate is coupled through the switch SW to the negative terminal. The current $I_{26}$ flowing through the primary winding 26, which also flows through the switch SW and the supply $V_{cc}$, as shown in FIG. 5, consists of two components, a positive half sinusoid of current related by the transformer turns ratio to the current $I_{RL}$ flowing in the secondary and a shaping component 14 which includes the magnetizing current $I_m$ of the primary. When the switch SW opens, the series circuit 18 discharges causing a negative half sinusoid of current to flow through the load resistor $R_L$, thus the required sinusoid AC voltage to the load $R_L$ is developed.

Although the switch SW is open at the instant the series resonant circuit 18 is fully charged and the current flow in the secondary circuit 30 is zero, a significant magnetizing current $I_m$ still flows in the primary winding 26. This current $I_m$ is interrupted and $I_{24}$ is caused to flow by the energy stored in the primary winding 26. Because of resonant action between variable capacitor 24 and primary winding 26, a voltage $V_{24}$ will appear across the capacitor 24. Also, since the voltage $V_{cc}$ can be considered as a short circuit for AC purposes, exactly the same wave shape appears across the switch SW. If the value of the capacitor 24 is correctly chosen, it will discharge to zero simultaneously with the series resonant circuit 18 in the secondary circuit 30. As a result, the energy stored in the magnetic field of the primary winding 26 and causing $I_{24}$ is transferred to the second circuit 30. Thus, the recovery of the primary circuit 34 is completed without loss. If the combination of variable capacitor 24 and primary winding 26 is considered as if it were a parallel resonant circuit, then it has a $Q$ point (quiescent operating point) of unity. $Q=I_{26}/I_{SW}=1$. No energy is stored from one cycle to the next; therefore, no circulating circuit remains during the following cycle. However, the effective $Q$ of this circuit during the recovery period is much higher. This is because it is related by transformer 28 to the relatively high $Q$ point of the series circuit 18 which is typically greater than or equal to 5. It is this phenomena together with the correctly chosen value of capacitor 24 that insures a smooth and effective recovery of primary winding 26 which is the essence of the $B_x$ mode of operation. Note that the transformer 28, in addition to its primary function of isolating the series circuit 18 from the voltage source $V_{cc}$, also enables the load to be correctly matched to the voltage source $V_{cc}$ simply by selecting an appropriate turns ratio.

The wave shapes shown in FIG. 5 illustrate the theoretical operation of the circuit shown in FIG. 4. Since switch voltage $V_{SW}$ and switch current $I_{SW}$ are developed alternately—each one being zero before the other begins to rise—it follows that no transient power losses through the generation of heat will be incurred due to the operation of the switch SW. Thus, the theoretical efficiency of this circuit is 100 percent. The current $I_{24}$ in recovery capacitor 24 is equal to a portion of the current $I_{26}$ in primary winding 26.

In the actual operation of the circuit shown in FIG. 4, the wave shapes shown in FIG. 6 were obtained. The upper three wave shapes shown in FIG. 6 show the $B_x$ amplifier operating at 125 kilohertz. Comparing these wave shapes with the corresponding theoretical versions shown in FIG. 5, it can be seen that they verify the theory of the $B_x$ operation. Referring to the second and third wave shapes $V_{SW}$, $I_{SW}$ and $I_{24}$, shown in FIG. 6, a person can see that there is relatively no loss due to crossover between the switch voltage and the switch current $I_{SW}$. Also, there is very little overlap between switch current $I_{SW}$ and capacitor current $I_{24}$. This crossover or overlap is a function of the transistor or operating frequency. Therefore, the energy stored in a primary winding 26 during the previous closed phase of the switch SW has been transferred to the secondary circuit 30 during the open phase and thus each cycle of the primary circuit starts afresh, no energy being carried over from the previous cycle.

The lower two wave shapes shown in FIG. 6 illustrate the magnetizing current $I_m$ that flows in the primary winding 26 of a transformer 28 when switch SW is closed and opened, and the second circuit 30 is disconnected from the load $R_L$. The recovery capacitor 24 still operates preventing the generation of a narrow high voltage spike that always occurs when a current carrying inductor is suddenly open-circulated. This means that the load $R_L$ can be disconnected or reconnected at any time without damage to the transistor 12 which is one of the features of this design verified many times in practice.

The diode 38, shown in FIG. 4, was selected for its high stored charge. This is because the long delay to turn on and high reverse recovery current of a slow diode generates the fast current pulse required to operate the slow transistor 12 at high speed. The supply capacitor 36 helps provide a uniform voltage from supply voltage $V_{cc}$ due to peak demands of switching operations. The value of the capacitor 24 is very important. If the value is too high, the circuit will not recover properly and significant losses in the primary circuit will occur. If the capacitor is too low, or omitted altogether, not only will there be significant power losses, but the transistor 12 may be destroyed by transient spikes. Also, capacitor 24 tunes out unwanted reactances in the collector of the transistor 12, thereby permitting higher operating frequencies. Therefore, the capacitor 24 provides three functions.

1. It protects the transistor 12 from damage due to transient spikes.

2. It increases the overall circuit efficiency.
3. It enables the $B_x$ amplifier to perform efficiently at higher frequencies than previous amplifiers.

Another embodiment of FIG. 1 is shown in FIG. 2 wherein like parts are given like numbers as is previously described in conjunction with FIG. 4. The major difference between FIG. 2 and FIG. 4 is in the feedback network, which comprises a winding 42 magnetically coupled to inductor 22 in series with a feedback capacitor 44 and resistor 46 connected to the input of transistor 12. Also, the bias for transistor 12 is provided by bias resistor 48, whereas the bias voltage in FIG. 1 is illustrated by battery $B_r$ but is not necessary for proper operation of the circuit. The values of the components in FIG. 2 are given in Table II. It should be realized that FIG. 2 was one of the preliminary designs and the value of the components given in Table II does not necessarily represent the best designed circuit, but is one way of utilizing the applicant's invention.

The essential components of the $B_x$ amplifier consist of:

A. DC supply.
B. A recovery capacitor of proper value.
C. Switch, either mechanical or electrical.
D. A transformer.
E. A series resonant circuit with a significantly high Q point.
F. A means for operating the switch at the required rate.

TABLE II

| | |
|---|---|
| Bias Resistor 48 | 4.7 kilohms |
| Feedback Resistor 46 | 10 ohms |
| Feedback Capacitor 44 | .15 microfarad |
| Transistor 12 | MJ423 |
| Diode 38 | IN647 |
| Capacitor 24 | 460 picofarad |
| Transformer 28 | 11.6 micro henrys |
| Capacitor 20 | 1260 picofarad |
| Inductor 22 | 6 micro henrys |

What is claimed is:

1. A transistor power amplifier using electronic components for operation in power supplies with high efficiency comprising:
a voltage source;
transistor switching means connected across said voltage source for controlling amplification of an input signal from a source of electrical current to supply an operational current to a load for producing an output signal;
shaping means located between said transistor switching means and said voltage source for preventing both the input signal and voltage from said source from being present in the switching means simultaneously to eliminate the generation of heat in the transistor switching means;
resonant means having a relatively high Q point connected between said load and transistor switching means for providing a smooth flow of said operational current; and
matching means connected to said resonant means and said switching means for isolating the input signal from the operational current to permit a sinusoidal output signal to energize from said load.

2. The transistor power amplifier, as recited in claim 1, wherein:
said shaping means is a capacitor across said matching means to eliminate transients in said matching means and allow quick recovery; and
said matching means is a transformer with a primary and secondary winding, said capacitor being connected across said primary winding so that, during recovery of said primary with the switching means deenergized the entire energy stored therein is transferred to said load means.

3. The transistor power amplifier, as recited in claim 2, wherein said resonant means comprises a series connected inductor-capacitor circuit between one side of said secondary winding and one side of said load, the opposite side of said secondary winding being connected directly to the opposite side of said load.

4. The transistor power amplifier, as recited in claim 3, further comprising a feedback means for transferring a portion of said output signal back to the input signal of said amplifier.

5. The transistor power amplifier, as recited in claim 3, wherein said feedback means comprises:
an inductor mutually coupled to the inductor in said inductor-capacitor circuit;
a second capacitor in series with said mutually coupled inductor to form a bandpass network; and
current limiting means for connecting said second capacitor to the input of said amplifier.

6. The transistor power amplifier, as recited in claim 5, further comprising:
a shunting diode between the input to said amplifier and the ground side of said voltage source; and
a bias resistor between the input to said amplifier and the voltage side of said voltage source.

7. An AC amplifier for power amplification, comprising:
switching means connected between a voltage source and a ground for controlling an operational signal derived from an input signal connected to a source of electrical current;
shaping means located between said switching means and said voltage source to prevent said input signal and voltage from simultaneously being present in said switching means to eliminate the possibility of electrical energy being converted to thermal energy in the switching means;
resonant means connected to said switching means and operating at a predetermined frequency for uniformly transmitting said operational signal to a load; and
matching means connected to said resonant means and said voltage source for isolating the input signal from the operational signal to create a sinusoidal output signal from the operational signal upon passing through said load.

8. The AC amplifier, as recited in claim 7, wherein:
said matching means is a transformer with a primary winding between said switching means and said voltage source and a secondary winding in series with said resonant means and said load; and
said shaping means has a first capacitor in parallel with said primary winding.

9. The AC amplifier, as recited in claim 8, wherein said switching means comprises a transistor with a diode shunting between the input and ground.

10. The AC amplifier, as recited in claim 9, wherein said resonant means is a series connected second capacitor and inductor, said first capacitor being variable to obtain a better match between said resonant means and said amplifier means, said second capacitor being variable to more accurately tune said resonant circuit.

* * * * *